United States Patent
Clingman et al.

(10) Patent No.: US 7,436,104 B2
(45) Date of Patent: Oct. 14, 2008

(54) NON-LINEAR PIEZOELECTRIC MECHANICAL-TO-ELECTRICAL GENERATOR SYSTEM AND METHOD

(75) Inventors: Dan J. Clingman, Auburn, WA (US); Darin J. Arbogast, Auburn, WA (US)

(73) Assignee: The Boeing Company, Chicago, IL (US)

( * ) Notice: Subject to any disclaimer, the term of this patent is extended or adjusted under 35 U.S.C. 154(b) by 17 days.

(21) Appl. No.: 11/551,515

(22) Filed: Oct. 20, 2006

(65) Prior Publication Data

US 2008/0100181 A1    May 1, 2008

(51) Int. Cl.
*H01L 41/113* (2006.01)
*H01L 41/12* (2006.01)
(52) U.S. Cl. .......................................... 310/339; 310/26
(58) Field of Classification Search .................... 310/26, 310/339
See application file for complete search history.

(56) References Cited

U.S. PATENT DOCUMENTS

| | | | | |
|---|---|---|---|---|
| 3,553,588 | A * | 1/1971 | Honig | 455/127.1 |
| 3,949,248 | A * | 4/1976 | Duffner et al. | 310/339 |
| 6,858,970 | B2 | 2/2005 | Malkin et al. | |
| 7,034,440 | B2 * | 4/2006 | Kim et al. | 310/339 |
| 2006/0119224 | A1 * | 6/2006 | Keolian et al. | 310/339 |
| 2006/0175937 | A1 * | 8/2006 | Clingman et al. | 310/339 |
| 2006/0238079 | A1 * | 10/2006 | Pei et al. | 310/339 |
| 2008/0092354 | A1 | 4/2008 | Clingman et al. | |

* cited by examiner

*Primary Examiner*—Thomas M Dougherty
(74) *Attorney, Agent, or Firm*—Harness, Dickey & Pierce, P.L.C.

(57) ABSTRACT

A non-linear, piezoelectric mechanical-to-electrical generator especially well adapted for use with a Stirling engine, to thus form an electrical power generation system. In one form the generator includes a flexible beam that is configured in a bowed orientation to exert a compressive stress on a piezoceramic stack. A mechanical, linearly reciprocating member is positioned against the flexible beam at a midpoint of the beam. The mechanical member applies a force to the flexible beam that initially tends to flatten the flexible beam, which increases the compressive stress applied to the piezoceramic stack, thus compressing the stack and causing it to generate an electrical output signal. When the mechanical member removes the force, the flexible beam reverts to its initial, bowed configuration. This allows the piezoceramic stack to decompress, and it generates another electrical signal. This alternating compressing and decompressing of the piezoceramic stack causes a series of electrical signals to be generated from the stack. The apparatus forms a lightweight, compact means for converting a linear, reciprocating mechanical output signal into electrical power.

12 Claims, 4 Drawing Sheets

NON-LINEAR PIEZOELECTRIC MECHANICAL-TO-ELECTRICAL GENERATOR SYSTEM AND METHOD

CROSS REFERENCE TO RELATED APPLICATIONS

The present application is related in general subject matter to the following applications, each of which is being filed concurrently with the present application, and each of which is incorporated by reference into the present application:

U.S. application Ser. No. 11/551,525;
U.S. application Ser. No. 11/551,388;
U.S. application Ser. No. 11/584,304;
U.S. application Ser. No. 11/584,305.

FIELD

The present disclosure relates to piezoelectric devices, and more particularly to a nonlinear piezoelectric generator that generates electrical power from a mechanical input.

BACKGROUND

Piezoelectric devices are presently being employed in greater numbers of applications and in a wide ranging area of technologies. Piezoelectric devices make use of one or more piezoelectric ceramic wafers that are adapted to bow or deform in response to an electric current applied to the wafer. Such piezoelectric wafers also produce an electrical output when they are flexed or deformed from an initial, non-flexed configuration. Thus, piezoelectric wafers are especially useful in applications involving actuators and vibration energy harvesting apparatuses. The following U.S. patents and applications involve various implementations of piezoelectric materials, and are each hereby incorporated by reference into the present application: U.S. Pat. No. 6,858,970 and U.S. Ser. No. 10/909,784, filed Jul. 30, 2004.

Another device which has only recently achieved practicality is a Stirling engine. Stirling engines have existed in various forms for many years, however, it has been recent breakthroughs in the design of engine chamber seals that has made these devices practical. A Stirling engine utilizes temperature gradients to convert thermal energy into mechanical energy. Typically, the Stirling engine includes one or more pistons that are driven in a reciprocating fashion by converting thermal energy into mechanical energy. Recently, Stirling engines have shown promise as a low cost, high efficiency solar powered generator for U.S. power grid and spacecraft electric power generation systems. The ability of the Stirling engine to meet or exceed the performance of concentrated photovoltaics has been recently recognized by engineers and researchers interested in exploring alternative power generation systems for use in spacecraft.

One drawback with a typical Stirling engine is that the mechanical energy is typically converted to electrical energy using a very large AC electromagnetic generator. A large electromagnetic generator, however, can be a serious drawback for spacecraft applications, where weight is an important consideration.

Thus, it would be highly desirable to provide some means for generating electric power from a mechanical input device, for example, from one or more pistons of a Stirling engine. It would further be highly desirable if such a device formed a small, lightweight, and highly efficient apparatus for converting mechanical energy to electrical power. Such a device would significantly enhance the utility of other components, such as Stirling engines. Such a device could enable a Stirling engine to be used in various power generating applications which, at the present time, are not feasible because of the size and weight of typical electromagnetic generators presently employed for use with Stirling engines in power generating applications.

SUMMARY

The present disclosure relates to a system and method for forming a non-linear, piezoelectric mechanical-to-electrical converter or power generator.

In one implementation, a non-linear, piezoelectric power generator is provided that includes a flexible element and an electrically responsive member that are arranged mechanically in series.

In one embodiment the flexible element is formed by a flexible beam. The flexible beam and electrically responsive member are further coupled such that a first end of the flexible beam is braced against a fixed structure, while a first end of the electrically responsive member is similarly braced or secured against a second structure. In one implementation, the first and second structures are fixed structures. The second ends of the flexible beam and the electrically responsive member are operably coupled together. The flexible beam and the electrically responsive member are further dimensioned such that the flexible beam assumes a first bowed configuration that exerts a compressive force on the electrically responsive member when no external force is being applied to the flexible beam. The reciprocating mechanical output component is positioned adjacent the flexible beam at an intermediate point along the length of the flexible beam. When the mechanical device presses against the bowed flexible beam, it tends to flatten the beam, which increases the compressive stress on the electrically responsive member, thus causing the electrically responsive member to generate an electrical output signal. When the mechanical force is removed from the flexible beam, or the beam is further flexed into another bowed configuration as the flexible beam is moved past an "over center" orientation, the compressive force on the electrically responsive member is concurrently reduced. This action also produces an electric current as the electrically responsive member is allowed to decompress, but one having a plurality opposite to that of the previously generated electric current. Thus, a reciprocating motion of the mechanical device causes an alternating flattening-bowing-flattening action on the flexible beam, which in turn causes an alternating compressing and decompressing of the electrically responsive member, and a resulting alternating polarity electric current generated by the member. Forming the flexible element in a beam-like configuration and placing the flexible element in a buckled configuration enables a force-to-displacement advantage to be achieved that would be difficult to achieve with other forms or configurations of biasing elements.

In one specific implementation, a mechanical output device comprises a piston of a Stirling engine. In this exemplary embodiment, the piston is disposed at a midpoint of the length of the flexible beam. The flexible beam and the electronically responsive member act to convert the mechanical reciprocating motion of the piston to electric power.

In one particular embodiment, the apparatus and method of the present disclosure enables the flexible beam to effectively act as a strain amplifier. The flexible beam generates a compressive pressure on the electrically responsive member that is approximately four times greater than what would be achieved by a pressure being exerted directly along the length of the electrically responsive member.

In one particular embodiment the electrically responsive member is formed by a multilayer, piezoceramic stack. In another embodiment the electrically responsive member is formed by a magnetostrictive material.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
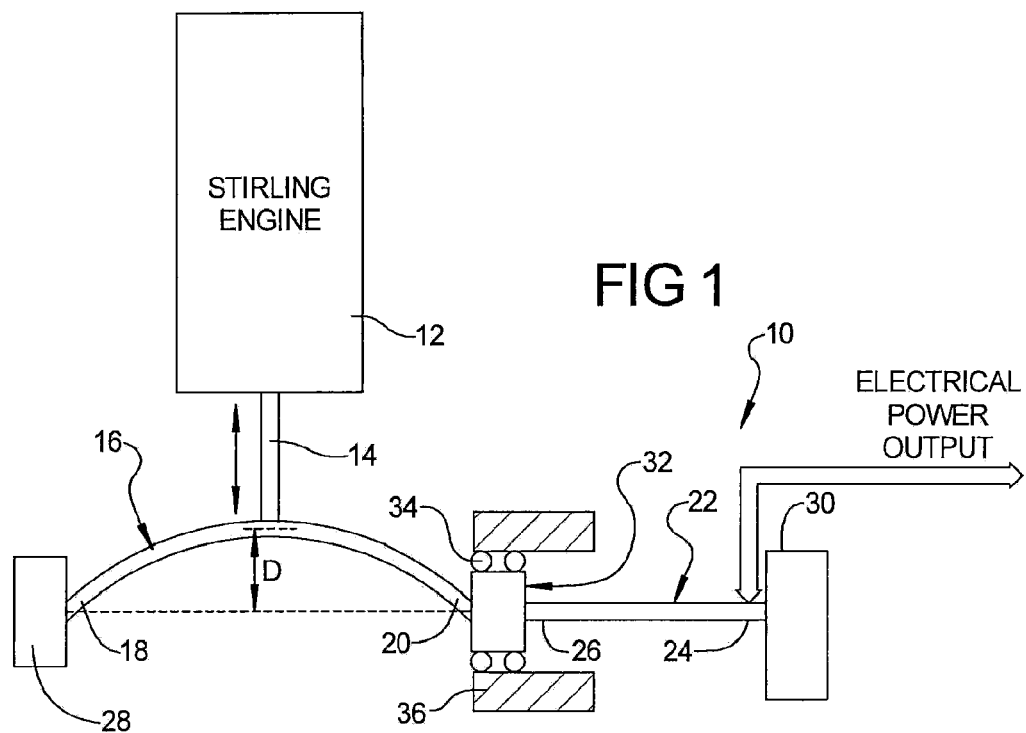
FIG. 1 is a simplified block diagram of a non-linear piezoelectric mechanical-to-electrical generator in accordance with one particular embodiment of the present disclosure, and showing a flexible beam and a piezoceramic stack of the apparatus in their initial orientations prior to an external mechanical force being applied to the flexible beam, with a Stirling engine being the device that is generating the mechanical input.

Referring to FIG. 1, there is shown a non-linear, mechanical-to-electrical generator apparatus 10 in accordance with one exemplary embodiment of the present disclosure. In this example, a Stirling engine 12 having a reciprocating output piston 14 is illustrated as the device that provides a mechanical input signal to the apparatus 10. However, it will be appreciated that any device that generates a reciprocating mechanical signal can be used with the apparatus 10. It is anticipated that the apparatus 10 will find particular utility in connection with a Stirling engine, as the apparatus 10 is able to readily convert the mechanical reciprocating motion of an output piston of such an engine to electric power. Stirling engines are discussed in the following patents, the disclosure of each of which is hereby incorporated by reference into the present disclosure: U.S. Pat. No. 6,871,495; U.S. Pat. No. 6,735,946 and U.S. Pat. No. 6,871,495.

The apparatus 10 includes a flexible beam 16 having a first end 18 and a second end 20. An electrically responsive member 22 in one form comprises a piezoceramic stack (i.e., a unitary stack of piezoelectric wafers), and has a first end 24 and a second end 26. Alternatively, the electrically responsive member 22 may be formed by a magnetostrictive material. The use of a piezoceramic stack or magnetostrictive material for the electrically responsive member 22 are both viewed as being equally applicable for use with the apparatus 10. Accordingly, while the following description will reference the electrically responsive member as "piezoceramic stack 22", it will be appreciated that a magnetostrictive material could readily be substituted in place of the piezoceramic material.

Figure 4:
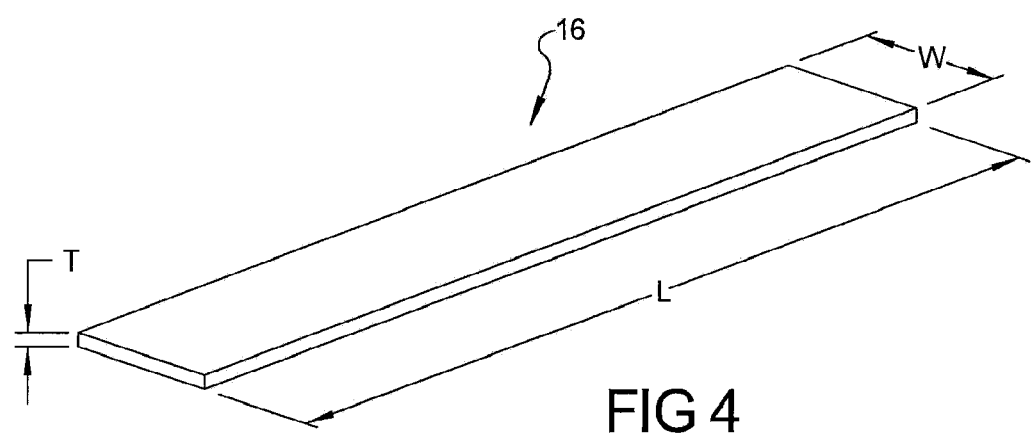
FIG. 4 is a perspective view of the flexible beam.

The flexible beam 16 may be formed from spring steel having a planar shape, as shown in FIG. 4, or as a planar leaf spring, or from any other material that is suitably flexible. The first end 18 of the flexible beam 16 is fixedly secured to a suitable support structure or frame member 28, while the first end 24 of the piezoceramic stack 22 is similarly fixedly secured to a support structure or frame member 30. The second ends 20 and 26 of the flexible beam 16 and the piezoceramic stack 22 may be secured directly to one another, or to an intermediate coupling assembly 32. Coupling assembly 32 includes a plurality of wheels 34 that are adapted to ride within a guide track or rail 36 to thus facilitate the smooth application and removal of a compressive force to/from the piezoceramic stack 22.

The flexible beam 16 and the piezoceramic stack 22 are also arranged such that their opposing free ends (i.e., ends 18, 20, 24 and 26) are all generally aligned along a common longitudinal axis extending through the piezoceramic stack 22. The Stirling engine 12 is preferably supported so that its piston 14 extends generally normal to the longitudinal axis extending through the piezoceramic stack 22. It will be appreciated that the stroke length of the piston 14 will be a factor that needs to be considered in determining the precise dimensions, and particularly the length, of the flexible beam 16.

With brief reference to FIG. 4, the flexible beam 16 has an overall (i.e., unbowed or "unbuckled") length "L", a thickness, and a width that may each vary widely to suit a specific application. In one exemplary form the length ("L") of the beam 16 is about 2.0 inches (50.4 mm), the width is about 0.5 inch (12.7 mm), and the thickness is about 0.030 inch (0.762 mm). The piezoceramic stack 22 may have a length that varies in accordance with the particular application with which the apparatus 10 is being interfaced with, and will be in part dependent on the length and stiffness of the flexible beam 16. In one exemplary form the uncompressed length of the piezoceramic stack may be about 0.5 inch (12.7 mm). The piezoceramic stack 22 may also take a variety of cross sectional shapes, for example rectangular, round, oval, square, or any other shape that might best suit the need of a particular application. In the present example, the piezoceramic stack 22 has a circular cross sectional shape having a diameter from about 0.375 inch to about 0.5 inch (9.525 mm-12.7 mm).

Figure 2:
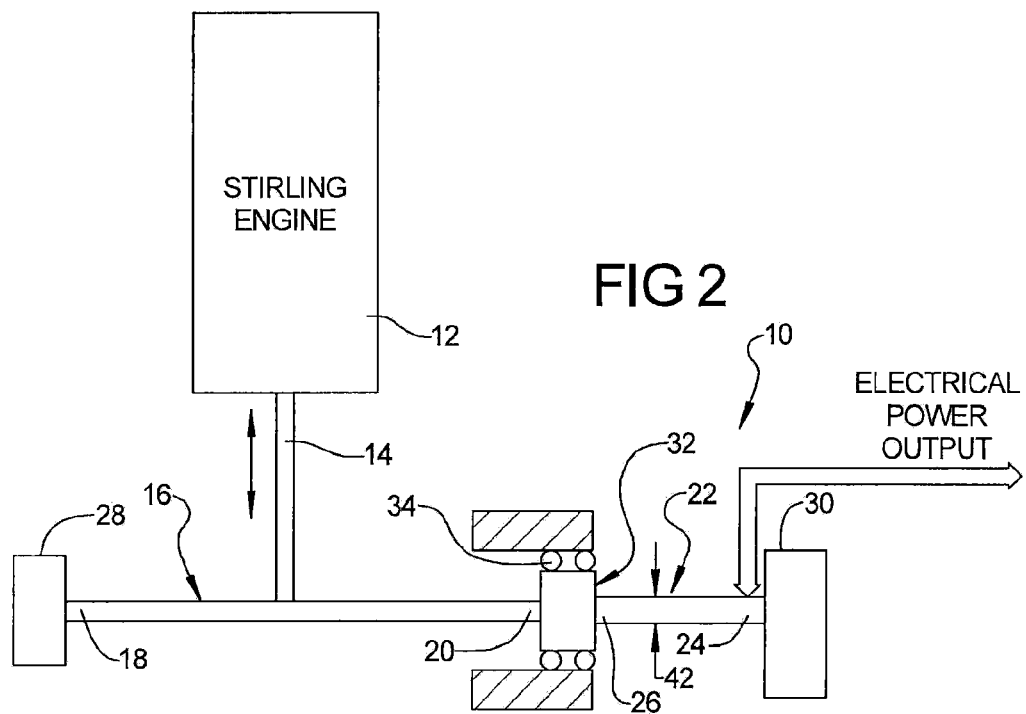
FIG. 2 is a simplified block diagram of the apparatus of FIG. 1, but with a piston of the Stirling engine extended to flatten the flexible beam, thus causing an increased compressive force to be exerted on the piezoceramic stack.
Figure 3:
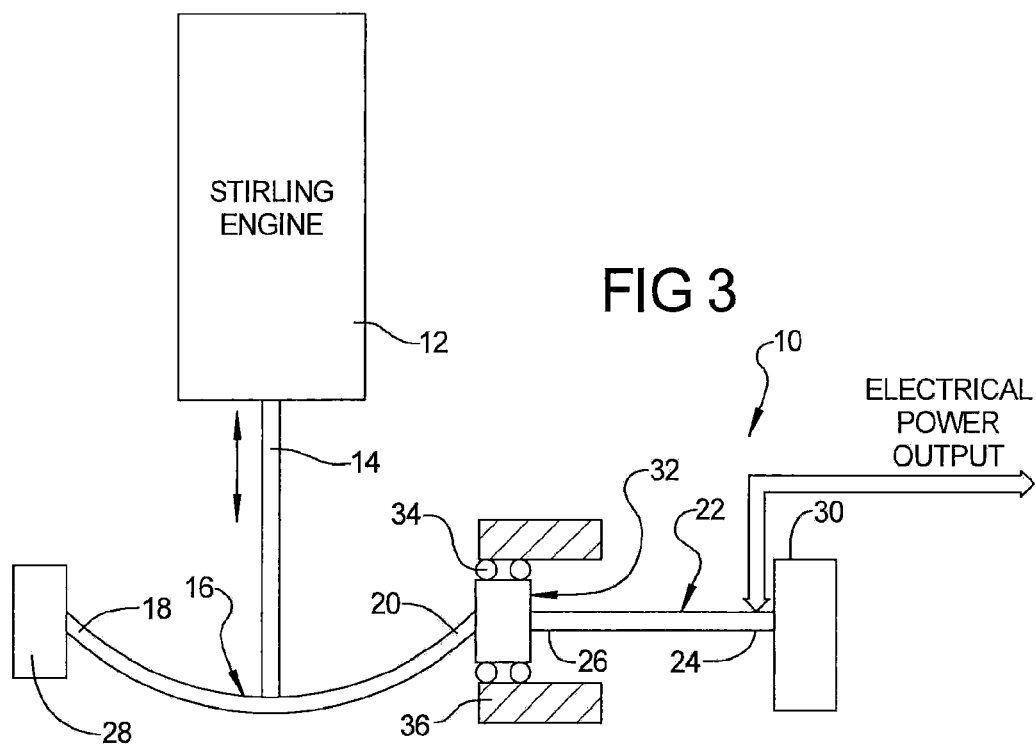
FIG. 3 is a simplified block diagram of the apparatus of FIG. 2, but with the piston of the Stirling engine fully extended to force the flexible beam past an over center position to a new bowed orientation.

Referring now to FIGS. 1-3, the operation of the apparatus 10 will be described. Referring initially to FIG. 1, the flexible beam 16 assumes one stable position. In this orientation the flexible beam is exerting a first, or minimum, degree of compressive force on the piezoceramic stack 22, but a force that is not sufficient to tangibly compress the piezoceramic stack 22. As the output piston 14 of the Stirling engine 12 initially begins to extend, it exerts a mechanical input force on the flexible beam 16. This flattens the beam 16, as indicated in FIG. 2. As the flexible beam 16 is flattened, it exerts a significantly increased compressive force on the piezoceramic stack 22, which causes the piezoceramic stack 22 to generate an electric current pulse output from electrical contacts (not shown) connected to the various layers thereof. This electrical pulse has a first polarity, for example a positive polarity. The orientation of the flexible beam 16 shown in FIG. 2 also represents an "over center" position. By "over center", it is meant that the flexible beam 16 will rapidly flex past this point as it is being moved toward the orientation shown in either FIG. 1 or FIG. 3, but will be unstable in the orientation of FIG. 2. In the position of FIG. 2, the flexible beam 16 is exerting a maximum degree of compressive force on the piezoceramic stack 22.

With reference specifically to FIGS. 2 and 3, as the piston 14 of the Stirling engine 12 extends to its maximum stroke length, it moves the midpoint of the flexible beam 16 past the over center position shown in FIG. 2. The flexible beam 16 then begins to release the compressive force on the piezoceramic stack 22. The compressive force continues to decrease as the flexible beam 16 moves into the orientation shown in FIG. 3. Once in the orientation shown in FIG. 3, the flexible beam 16 is again exerting the same minimum force as it did in the orientation shown in FIG. 1. The orientation shown in FIG. 3 forms a second stable position for the flexible beam 16. As the flexible beam 16 moves from the orientation shown in FIG. 2 to that shown in FIG. 3, the decompression of the piezoceramic stack 22 causes the stack 22 to generate another electrical output pulse. This electrical pulse will, however, be of the opposite polarity to the pulse that was created by the compressive movement described in connection with the movement of the flexible beam 16 from the orientation shown in FIG. 1 to that shown in FIG. 2. Thus, each complete extension or complete retraction of the piston 14 generates two electrical pulses from the piezoceramic stack 22. One complete cycle of the piston 14 (i.e., one extension stroke and one retraction stroke) thus generates four electrical pulses from the piezoceramic stack 22.

A significant advantage of the bowed configuration of the flexible beam 16 is that the flexible beam effectively operates as a "strain amplifier". By this it is meant that a relatively small mechanical motion (i.e., short mechanical stroke) applied at the midpoint of the flexible beam 16 will cause the beam 16 to generate a significantly large compressive pressure on the piezoceramic stack 22. For example, the compressive pressure generated on the second end 26 of the piezoceramic stack 22 may be up to or greater than 100 times the compressive pressure that would otherwise be generated by a linear linkage applying a force to the second end 26 of the piezoceramic stack 22. Obviously, the degree of amplification achieved will depend on the stiffness of the flexible beam 16, the length of the beam 16 and other design criteria. The stiffness and length of the flexible beam 16 can be tailored to meet the needs of a particular application.

The change in length of the piezoceramic stack 22, as a result of a compressive pressure from the flexible beam 16, is represented by dimension 38 in FIG. 2. Mathematically, this displacement can be expressed by the following formula:

$$\Delta^{Piezoceramic}_{stack} = \frac{\pi^2 D^2}{4L}$$

where "D" represents the distance separating a line bisecting the free ends of the flexible beam 16, and a line tangent to the midpoint of the beam 16 (FIG. 1); and The "critical" force required to move the flexible beam 16 between its two stable positions described above may also vary to suit the needs of a specific application. The critical force is also sometimes referred to as the "critical buckling load". In the exemplary embodiment being discussed, the critical force "Pcr" can be expressed by the formula:

$$Pcr = \frac{\pi^2 EI}{L^2}$$

where "E" is the elastic modulus of the material of the flexible beam 16;

where "I" is the area moment of inertia of the flexible beam 16; and where "L" is the length of the flexible beam 16.

The apparatus 10 can also be used in connection with a Stirling engine to form a "refrigerator", by intermittently applying and removing an electric current to the piezoceramic stack 22 that causes intermittent bowing and unbowing of the stack 22. The apparatus 10 is also expected to find utility in other applications where an electrical power output signal is desired in response to linear movement of a mechanical member.

Figure 5:
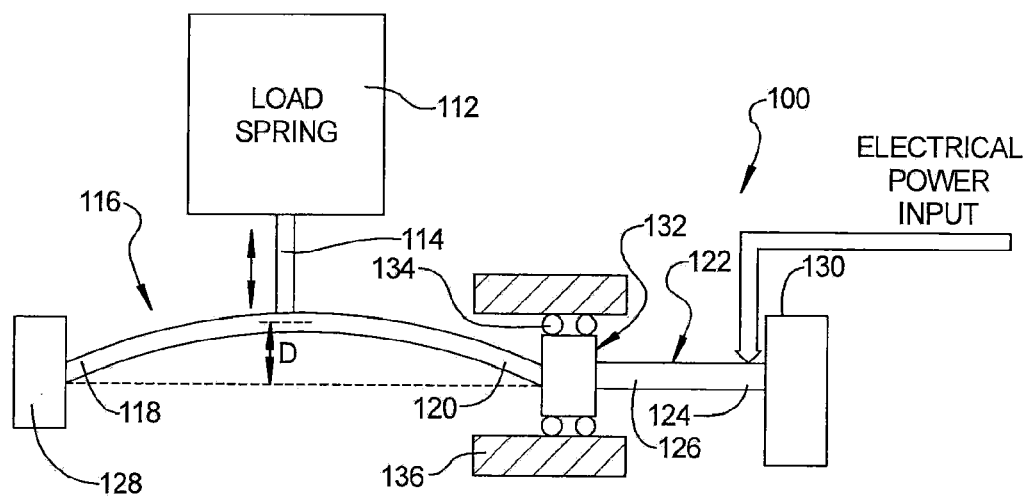
FIG. 5 is a simplified block diagram of one embodiment of an alternative implementation of the apparatus and method in which a piezoceramic stack is used to form an electrical-to-mechanical transducer to drive a load spring.

Referring to FIG. 5, a transducer in the form of an actuator apparatus 100 is shown in accordance with an alternative implementation of the teachings of the present disclosure. Components in common with those described in connection with apparatus 10 will be denoted by reference numerals increased by a factor of 100 over those used to describe the embodiment shown in FIGS. 1-4.

The apparatus 100 is substantially similar to the apparatus 10, and includes an electrically responsive member 122 which is installed under compression by a bowed flexible beam 116, which itself is also installed under compression to assume a slightly bowed or buckled shape. Again, the electrically responsive member 122 may be formed by a piezoceramic stack or by magnetostrictive material. For convenience, component 122 will be referred to as the "piezoceramic stack". The principal difference between apparatus 10 and apparatus 100 is that with apparatus 100, an electrical signal (e.g., a voltage) is alternately applied to and removed from the piezoceramic stack 122, which causes a corresponding alternating expansion (i.e., lengthening) and contraction (i.e., shortening lengthwise) of the stack 122. However, the flexible beam 116 in this embodiment does not flatten or move over center, as with the apparatus 10.

Figure 6:
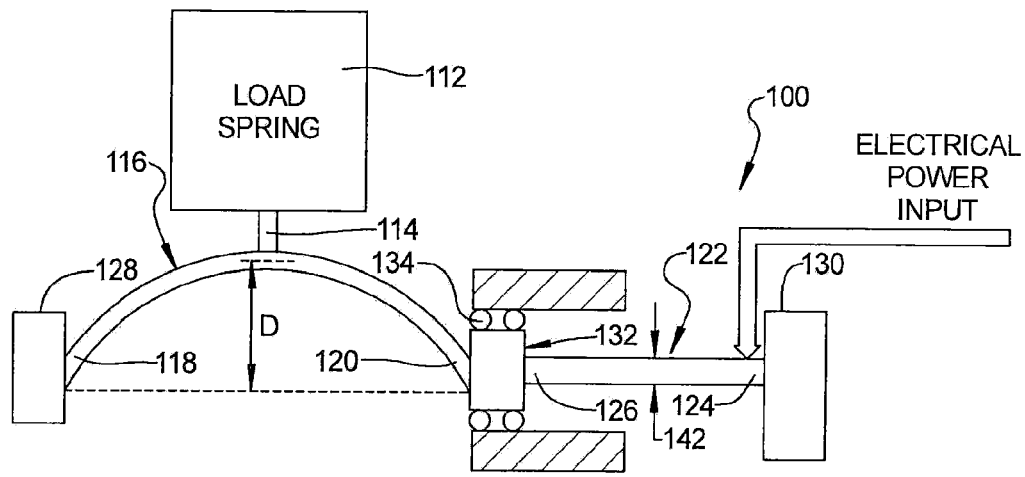
FIG. 6 is a block diagram of the apparatus of FIG. 5 but with a flexible beam of the apparatus being bowed by the force of the expanded piezoceramic beam, to thus drive an input member associated with a load spring in a linearly manner.

When the piezoceramic stack 122 lengthens, it urges coupling assembly 132 to move to the left, as indicated in FIG. 6. As this occurs, the flexible beam 116 is further bowed into the shape shown in FIG. 6. A linear member 114 in contact with the flexible beam 116 at an intermediate point along the length of flexible beam 116 is driven linearly as the flexible beam 116 bows. The member 114 moves in an up and down oscillating motion in accordance with the expansion and retraction of the piezoceramic stack 122. The member 114 may form a portion of a load spring 112 or any other device able to receive an oscillating mechanical signal.

An advantageous feature of the apparatus 100 is that the piezoceramic stack 122 provides a maximum available force at the beginning of its lengthening stroke, where the apparatus provides maximum stroke multiplication. At the end of the piezo stack 122 motion where available force is minimum, the motion amplification is minimum resulting in the ability of the apparatus to transfer more energy to a spring-like load than would be possible if the motion multiplication has a linear relationship.

The following equation shows the relationship between piezoceramic stack 122 motion and beam 116 center motion:

$$\frac{\Delta \text{Piezoelectric stack}}{D} = \frac{\pi^2 D}{2L}$$

where "D" is the distance separating a line bisecting the free ends of the beam 116 (FIG. 5) and a line tangent to the midpoint of the beam 116; and where "L" is the unbent (i.e., flat or unbowed) length of the beam 116.

Figure 7:
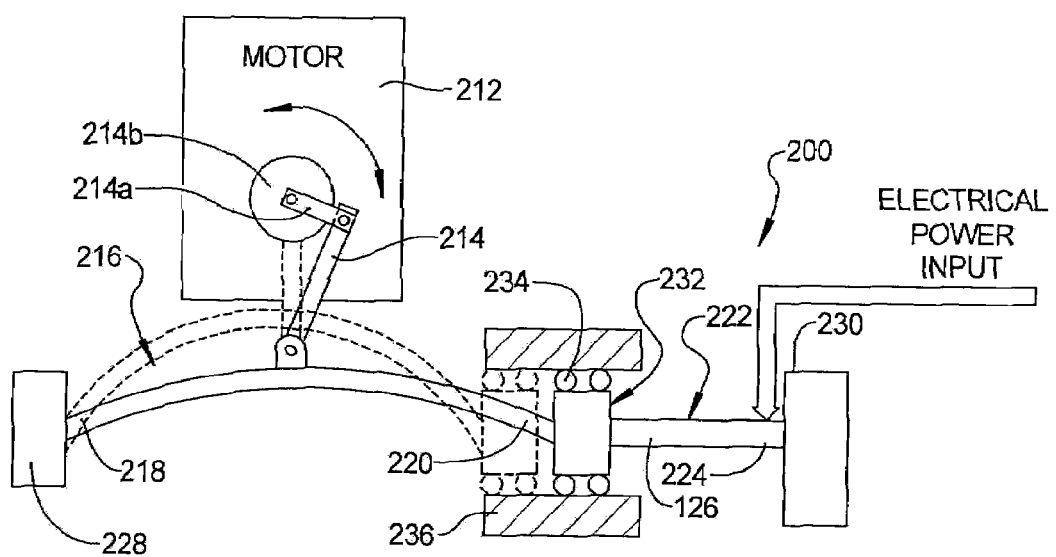
FIG. 7 is a simplified illustration showing how the apparatus of FIG. 5 could be configured to form a crankshaft-like driving arrangement to impart rotational movement to a rotationally supported member, to thus drive a motor.

Referring to FIG. 7, a motor apparatus 200 is illustrated in accordance with another embodiment of the present disclosure. The motor apparatus 200 is identical in construction to the apparatus 100 with the exception that an output member 214 is coupled pivotally at one end to a flexible beam 216. At its opposite end, the member 214 is pivotally coupled via a linkage assembly 214a to a rotationally mounted crank 214b. Apparatus 200 can thus be used to drive a crankshaft like output arrangement from the alternating bowing motion of the piezoceramic stack 222, to thus create rotational motion from the alternating compressing and decompressing of the piezoceramic stack 222.

While various embodiments and/or implementations have been described for the subject matter of the present disclosure, it will be appreciated that these are merely exemplary, and that other forms of transducers could be implemented from the teachings presented herein.

What is claimed is:

1. A non-linear power generator system comprising:
   a flexible beam for receiving a mechanical input, the flexible beam being supported in a bowed configuration;
   an electrically responsive member supported against one end of the flexible beam so as to be under a compressive force exerted by said flexible beam; and
   said flexible beam being adapted to move towards a flattened shape from said bowed shape in response to said mechanical input, to transmit said mechanical input to said electrically responsive member, to cause a compression of said electrically responsive member that results in an electrical output signal being generated by said electrically responsive member.

2. The system of claim 1, wherein said mechanical input comprises an oscillating mechanical input signal.

3. The system of claim 2, wherein said mechanical input is provided by a piston of a Stirling engine.

4. The system of claim 1, further comprising a coupling assembly including a plurality of wheels for interfacing an end of said flexible beam to an end of said electrically responsive member.

5. The system of claim 1, wherein a change in length of said electrically responsive member is approximated by the formula:

$$\Delta \text{ length of electrically responsive member} = \frac{\pi^2 D^2}{4L}$$

where "D" represents the distance separating a line bisecting the free ends of the flexible beam, and a line tangent to the midpoint of the beam; and where "L" represents the length of the unbowed flexible beam.

6. The system of claim 1, wherein said flexible beam provides a varying force amplification factor approximated by the following equation:

$$Fm = \frac{\pi^2 D}{2L}$$

where Fm is the force magnification factor of said mechanical input signal.

7. The system of claim 1, wherein said electrically responsive member comprises a piezoceramic stack.

8. The system of claim 1, wherein said electrically responsive member comprises a magnetostrictive material.

9. A method for generating electrical power from a mechanical signal, comprising:
   using a flexible beam secured under compression to assume a bowed orientation, to receive said mechanical signal;
   using said flexible beam to transmit said mechanical signal to an electrically responsive member;
   supporting said electrically responsive member such that said member experiences a compressive stress from said flexible beam; and
   using said flexible beam to alternatively compress and decompress said electrically responsponsive member, in response to said mechanical signal, to generate electrical output signals from said electrically responsive member.

10. The method of claim 9, wherein using said flexible beam to transmit said mechanical signal comprises using said flexible beam to also amplify said mechanical signal as said mechanical signal is applied by said flexible beam to said electrically responsive member.

11. The method of claim 9, further comprising using a Stirling engine to generate said mechancial signal.

12. The method of claim 9, wherein using said flexible beam to transmit said mechanical signal to an electrically reponsive member comprises using said flexible beam to transmit said mechanical signal to one of a piezoceramic stack and a magnetostrictive member.

* * * * *